US011621543B2

(12) United States Patent
O'Daniel

(10) Patent No.: US 11,621,543 B2
(45) Date of Patent: Apr. 4, 2023

(54) OPTICS FOR LASER ARRAYS

(71) Applicant: FINISAR CORPORATION, Sunnyvale, CA (US)

(72) Inventor: Jason O'Daniel, Sunnyvale, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 261 days.

(21) Appl. No.: 16/995,270

(22) Filed: Aug. 17, 2020

(65) Prior Publication Data

US 2021/0057889 A1 Feb. 25, 2021

Related U.S. Application Data

(60) Provisional application No. 62/889,413, filed on Aug. 20, 2019.

(51) Int. Cl.
*H01S 5/42* (2006.01)
*H01S 5/183* (2006.01)
*H01S 5/0234* (2021.01)
*H01S 5/02253* (2021.01)
*H01S 5/042* (2006.01)

(52) U.S. Cl.
CPC ............ *H01S 5/423* (2013.01); *H01S 5/0234* (2021.01); *H01S 5/02253* (2021.01); *H01S 5/042* (2013.01); *H01S 5/18305* (2013.01)

(58) Field of Classification Search
CPC .... H01S 5/423; H01S 5/02253; H01S 5/0234; H01S 5/042; H01S 5/18305
See application file for complete search history.

(56) References Cited

U.S. PATENT DOCUMENTS

2018/0198254 A1* 7/2018 Tatum ................. H01S 5/18391
2019/0115725 A1* 4/2019 Lai ...................... H01S 5/18397
2020/0251882 A1* 8/2020 Lyon ................... H01S 5/18305

* cited by examiner

*Primary Examiner* — Yuanda Zhang
(74) *Attorney, Agent, or Firm* — Blank Rome LLP

(57) ABSTRACT

In one example, a laser assembly may include a substrate, a lens array, and a laser array. The lens array may be positioned on a first side of the substrate. The laser array may be positioned on a second side of the substrate opposite the first side. Lasers of the laser array may be oriented to generate optical signals through the substrate to corresponding lenses of the lens array. The lens array may include at least one concave lens and at least one convex lens. The concave and convex lenses may map the irradiance of the lasers to a common target irradiance profile, resulting in an alignment tolerant laser assembly.

20 Claims, 9 Drawing Sheets

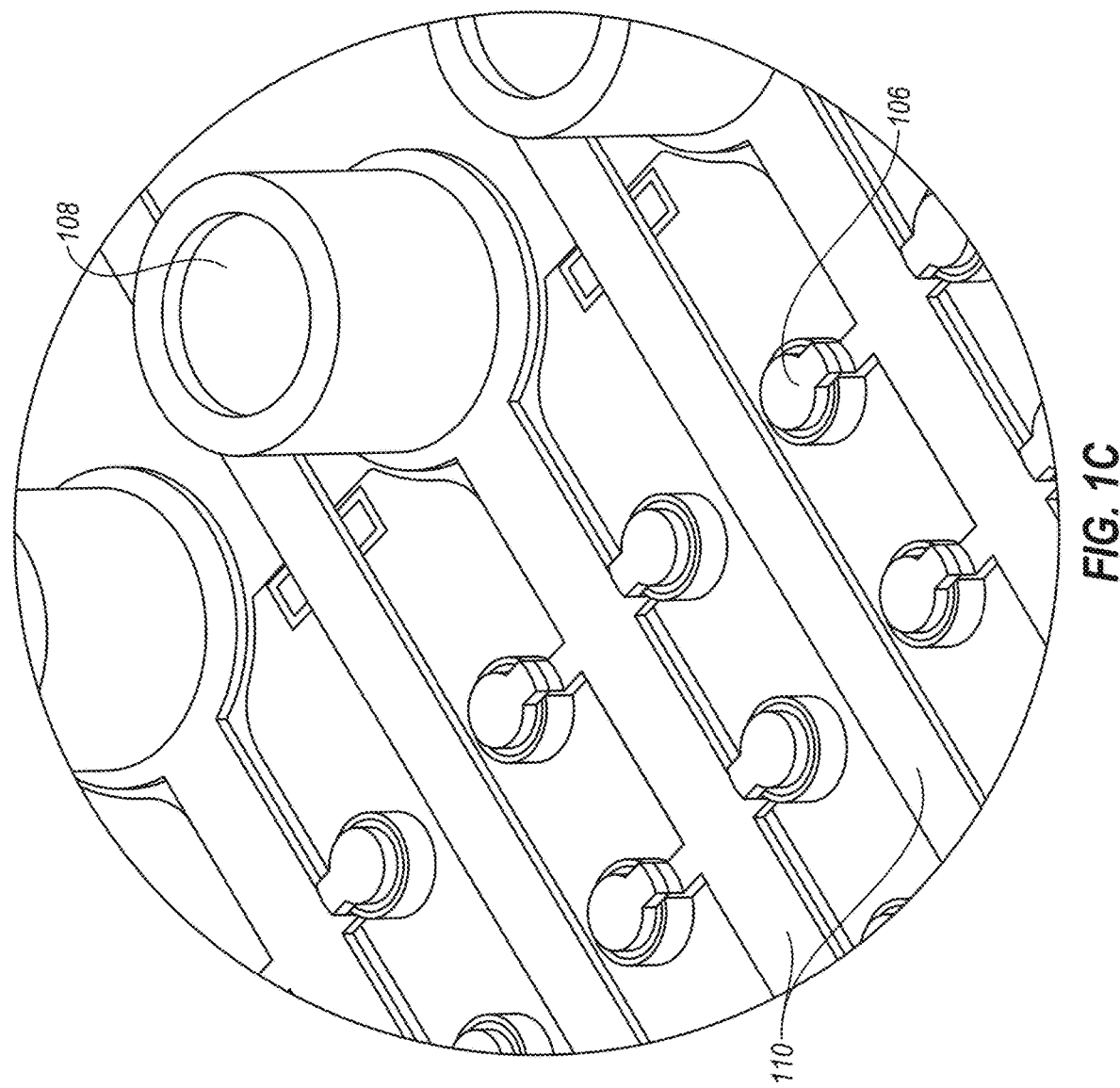

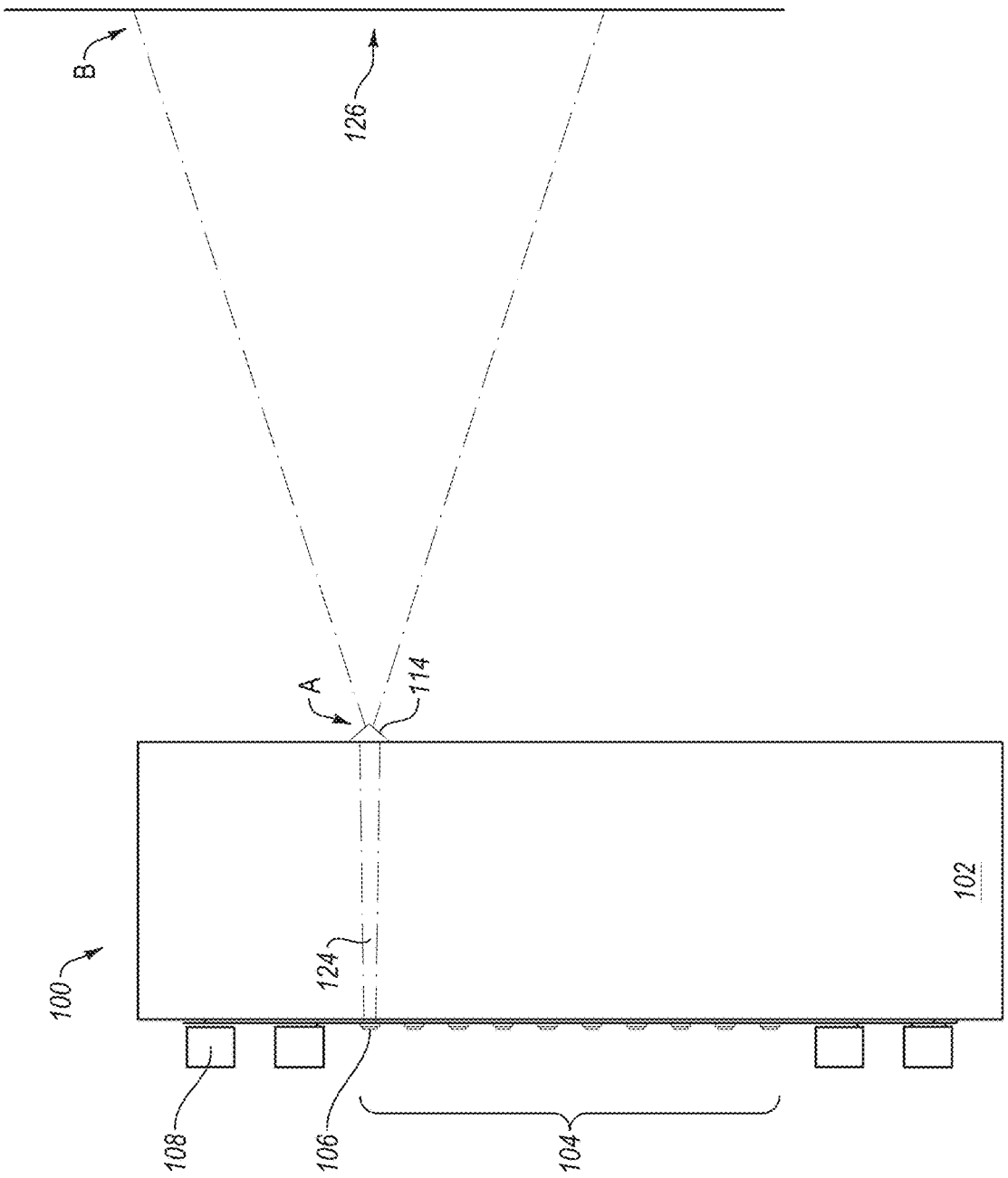

OPTICS FOR LASER ARRAYS

CROSS-REFERENCE TO RELATED APPLICATIONS

This application claims priority to and the benefit of U.S. Provisional Patent Application No. 62/889,413 filed Aug. 20, 2019, titled OPTICS FOR LASER ARRAYS, which is incorporated herein by reference in its entirety.

BACKGROUND

Unless otherwise indicated herein, the materials described herein are not prior art to the claims in the present application and are not admitted to be prior art by inclusion in this section.

The present disclosure generally relates to laser assemblies and optics for laser assemblies.

Laser assemblies may be used to provide light sources or illumination in a variety of circumstances. For example, laser assemblies made be used as illumination sources for time-of-flight (ToF) sensors. A ToF sensor is a range imaging sensor that employs time-of-flight techniques to resolve distance between the sensor and a target, by measuring the round trip time of an artificial light signal (e.g., the time it takes the light signal to travel from the sensor, to the target, and back to the sensor). The light signal may be generated by any suitable illumination source, such as a laser. Generally, ToF sensors scan an entire scene (or a portion thereof) with each laser pulse, rather than point-by-point with a laser beam as generally used in scanning LIDAR systems. Accordingly, light sources used for ToF sensors may cover a significant portion or the entirety of a scene, and this may be referred to as flood illumination.

The subject matter claimed herein is not limited to implementations that solve any disadvantages or that operate only in environments such as those described above. Rather, this background is only provided to illustrate one example technology area where some implementations described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

In one example, a laser assembly may include a substrate, a lens array, and a laser array. The lens array may be positioned on a first side of the substrate. The laser array may be positioned on a second side of the substrate opposite the first side. Lasers of the laser array may be oriented to generate optical signals through the substrate to corresponding lenses of the lens array. The lens array may include at least one concave lens and at least one convex lens. The concave and convex lenses may map the irradiance of the lasers to a common target irradiance profile, resulting in an alignment tolerant laser assembly.

In another example, a laser assembly may include a substrate, a lens array, and a laser array. The lens array may be positioned on a first side of the substrate. The laser array may be positioned on a second side of the substrate opposite the first side. Lasers of the laser array may be oriented to generate optical signals through the substrate to corresponding lenses of the lens array. The lens array may include a first portion including positive optics and a second portion including negative optics. The positive optics and negative optics may map the irradiance of the lasers to a common target irradiance profile, resulting in an alignment tolerant laser assembly.

In yet another example, a laser assembly may include a substrate, a laser array, and a field mapping optic. The laser array may be positioned on a first side of the substrate. The laser array may include lasers oriented to generate optical signals directed through the substrate. The field mapping optic may refract optical signals from lasers of the laser array to a desired irradiance at a target. The field mapping optic may be positioned on a second side of the substrate opposite the first side. The field mapping optic may include a positive optic and a negative optic. The positive and negative optics may map the irradiance of the lasers to a common target irradiance profile, resulting in an alignment tolerant laser assembly.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 1C is a bottom perspective view of a portion of the laser assembly of FIG. 1A.

FIG. 3 is a cross-sectional schematic view of the laser assembly of FIGS. 1A-1C.

DETAILED DESCRIPTION

Figure 1A:
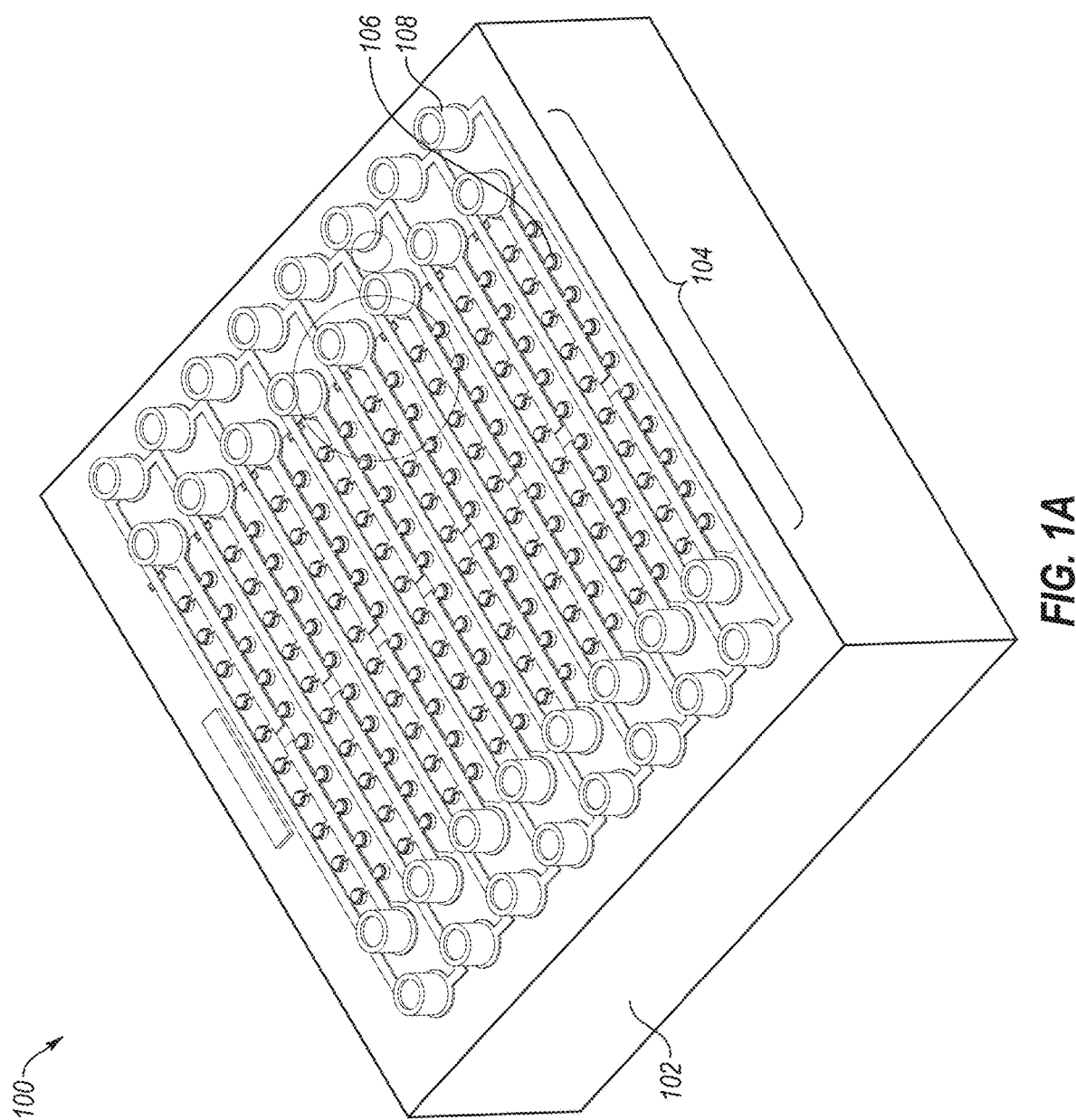
FIG. 1A is a bottom perspective view of an example laser assembly.

The present disclosure generally relates to laser assemblies and optics for laser assemblies.

Laser assemblies may be used to provide light sources or illumination for time-of-flight (ToF) sensors, although the concepts described herein may be implemented in laser assemblies used in any suitable circumstance. ToF sensors may include an illumination source, optics, an image sensor, driver electronics, and a computation device. The illumination source may generate optical signals to illuminate a scene. In some circumstances, the optical signals may be RF modulated to relatively high speeds (e.g., up to 100 MHz) to be detected by phase detector imagers.

Optics may include any suitable optical components to diffuse, direct, focus, refract and/or modulate the optical signals. The optical components may be optically coupled to a laser or laser array to direct the optical signals from the laser to the target. Additionally or alternatively, the optical components may be optically coupled to an image sensor to direct optical signals returning from the target to the image sensor. In one example, a lens may gather optical signals reflected from the target and images the environment onto the image sensor (e.g., focal plane array). In another example, an optical band-pass filter may be used to suppress non-pertinent light and reduce noise by only passing optical signals with the same wavelength as is generated at the illumination unit.

To decrease costs and create more compact laser assemblies, the density of components in laser assemblies may be increased. For example, high density laser sources, with many lasers integrated into a small space, may be implemented in laser assemblies. Arrays of multiple lasers integrated on one chip may lead to higher density and lower manufacturing costs compared to laser assemblies with discrete lasers.

However, increasing the density of components and/or integrating multiple lasers on the same chip may lead to various challenges. For example, it may be more difficult to design suitable optics and optical components for high density laser arrays, because the optical components are smaller and positioned closer to one another, and may also be positioned closer to other components. In addition, higher density and/or smaller optical components may be more susceptible to variations in manufacturing. Since the optical components are relatively small, even small variations may lead to significant changes in optical performance, which may render optical components unsuitable for use.

It may be more difficult to design suitable optics and optical components for high density laser arrays, because the optical components are smaller and positioned closer to one another, and may also be positioned closer to other components. In addition, higher density and/or smaller optical components may be more susceptible to variations in manufacturing. Since the optical components are relatively small, even small variations may lead to significant changes in optical performance, which may render optical components unsuitable for use.

"Tolerance" generally refers to the range of variation permitted for specific dimensions in a manufactured component, such as an optical component. As the density of components increases and/or the components become smaller, their manufacturing tolerance generally decreases. However, some manufacturing processes necessarily have certain variations, which may exceed the tolerance for a given component. Accordingly, it may be desirable to design components with tolerances that do not exceed the variations inherent in the desired manufacturing process. The concepts described herein may be implemented to create more tolerant optics and/or optical components, for example, so that tolerances do not exceed the variations inherent in some manufacturing processes.

Thus, the disclosed configurations include laser assemblies with tolerant optics and/or optical components. The disclosed configurations may be implemented in laser assemblies with compact high density laser arrays, while maintaining high yields and reliability. The disclosed configurations may be less susceptible to variations in manufacturing. Furthermore, the disclosed configurations may permit optical components and/or other components, such as lasers, to be positioned closer to one another. In addition, the described components may permit high density optical components to be manufactured without exceeding desired tolerances. Furthermore, the concepts described herein may be implemented to decrease the size of laser assemblies, while maintaining relatively low manufacturing costs, which in turn may result in more compact and/or more cost effective ToF sensors.

Generally, emitters for flood illuminators (such as VCSELs or the like) generate optical signals with optical profiles which may not be ideal for illuminating a target, so diffusers may be implemented to change the optical profile in a desired profile more suitable for illuminating the target. Typically a single diffuser is used to diffuse light from many emitters into a desired optical profile. Since the waves of the optical signals are diverging in nature and are coming from multiple emitters, any given point on the diffuser optical surface will have optical signal rays coming from multiple different directions. This makes it difficult to diffuse the optical signals into a desired optical profile without a significant amount of the optical signals bleeding outside the intended illumination area.

Accordingly, the disclosed embodiments include configurations where each emitter is mapped individually, to generate a desired optical profile individually or as a whole when the optical signals of multiple emitters are combined. In such configurations, the power of the optical signals in the desired illumination area can be significantly higher, providing higher overall optical efficiency. Furthermore, the described configurations include optical field mapping arrays and/or diffusers.

Various assembly and packaging configurations are implemented in manufacturing laser assemblies. One example is flip chip laser assemblies, which interconnect components using solder bumps that have been deposited onto pads. In flip chip configurations, solder bumps may be deposited on pads on a top side of a first component, the first component may be flipped over so that its top side faces down, and aligned so that its pads align with matching pads on a second component. The first and second components may be mechanically and electrically coupled to one another by solder reflow, such that the pads of the first and second components are attached to one another by the solder bumps. Flip chip configurations may be contrasted with wire bonding configurations, which typically have two components which are both mounted upright, one on top of another, with pads on top of both components, and wires used to electrically couple the pads.

The disclosed embodiments include configurations for laser assemblies with flip chip configurations. For example, the described configurations include optical field mapping arrays and/or diffusers integrated with flip-chip laser assemblies. Field mapping may refer to optics that refract or redistribute irradiance of optical signal into a desired irradiance at a target surface a sufficient distance from the optic. Optical field mapping may also be referred to as irradiance reshaping, irradiance redistribution, laser beam shaping, or freeform surface illumination, among others.

One challenge of implementing field mapping optics in flip-chip laser assemblies is that the fabrication tolerances required for optical alignment of the optics to the emitter may be beyond fabrication tolerance capabilities. Accordingly, the described embodiments include a positive (e.g., more convex or converging) optic and a negative (e.g., more concave or diverging) optic. In some circumstances, such optics can be designed for the same desired output profile. These pairs of opposite optics (which may be nearly equal in number) may counterbalance small alignment offsets (e.g., within a few microns). Such configurations may permit the optics to be aligned with the emitter within fabrication tolerance capabilities.

Figure 1B:
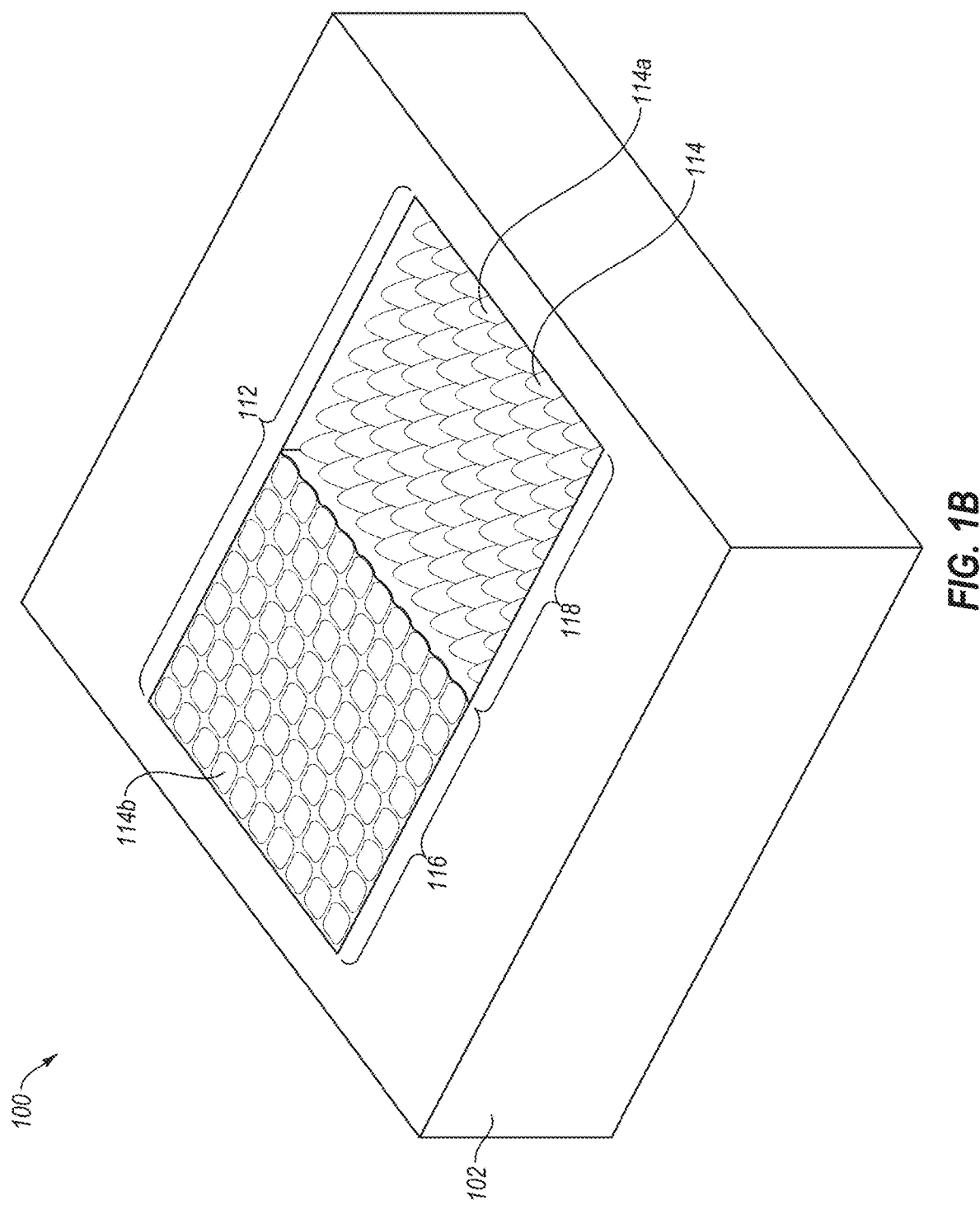
FIG. 1B is a top perspective view of the laser assembly of FIG. 1A.

FIG. 1A is a bottom perspective view of an example laser assembly 100, and FIG. 1B is a top perspective view of the laser assembly 100. With reference to FIGS. 1A and 1B, the laser assembly 100 will be described in further detail. The laser assembly 100 may include a substrate 102 with various electrical and/or optical components positioned thereon, or integrated with the substrate 102.

As shown in FIG. 1A, a laser array 104 may be positioned on the substrate 102. The laser array 104 may include multiple emitters or lasers 106 (only one of which is labeled in the figures to more clearly illustrate the other components shown). In the illustrated configuration, the lasers 106 are arranged in rows or columns, resulting in a substantially rectangular arrangement of the laser array 104, although other configurations may be implemented. Although the lasers 106 may be any suitable lasers, in some aspects the lasers 106 may be vertical-cavity surface-emitting lasers (VCSELs).

The substrate 102 may be formed of a material that is transparent to certain wavelengths of electromagnetic radiation, such as the optical signals generated by the lasers 106. For example, the substrate 102 may include or be formed of gallium arsenide (GaAs) or another suitable substrate material. The lasers 106 may be oriented to generate and transmit optical signals through the substrate 102. As used herein, "transparent" refers to a characteristic of a material that transmits electromagnetic radiation of specific wavelengths (such as wavelengths generated by the lasers 106), but not necessarily visible light wavelengths.

The laser assembly 100 may include electrical contacts 108 to electrically couple the lasers 106 to a power source (in the figures, only one of the electrical contacts 108 is labeled to more clearly illustrate the other components shown). The electrical contacts 108 may be configured to transmit electrical signals to drive the lasers 106. The illustrated configuration includes two rows of the electrical contacts 108 flanking two sides of the laser array 104 (e.g., two rows of the electrical contacts 108 on one side of the laser array 104, and two rows of the electrical contacts 108 on the other side of the laser array 104). One row of the electrical contacts 108 may be coupled to a laser driver circuit and the other row of the electrical contacts 108 may be coupled to a fixed supply or fixed electrical current source. The electrical contacts 108 may be coupled to the lasers 106 of the laser array 104 with electrical couplings or traces positioned on the surface of the substrate 102. Accordingly, the electrical contacts 108 may supply a power source and a ground to each of the lasers 106 to drive the lasers 106 to transmit optical signals.

With continued reference to FIGS. 1A-1B, the laser array 104 may be positioned on a first side or first surface of the substrate 102, and optics or optical components may be positioned on an opposite second side or second surface of the substrate 102. As shown in FIG. 1B, the laser assembly 100 may include a field mapping lens array 112 positioned on the substrate 102. As used herein, "field mapping" refers to an optic that refracts or redistributes irradiance of optical signal into a desired irradiance at a target surface a sufficient distance from the optic. Field mapping optics can be designed individually for multiple sources to generate a collective output based on the multiple sources. Thus, the lens array 112 may include multiple lenses 114 (only one of which is labeled). Each of the lenses 114 may correspond to one of the lasers 106 on the other side of substrate 102. Each of the lenses 114 may refract or redistribute irradiance of optical signals of a corresponding one of the lasers 106.

As explained above, the lasers 106 may be oriented to generate and transmit optical signals through the substrate 102. Thus, the lenses 114 may diffuse, transmit, direct, refract and/or focus the optical signals from the lasers 106 after they have travelled through the substrate 102. Each of the lenses 114 may be optically aligned and/or substantially centered with respect to each corresponding laser 106. In some configurations, the lens array 112 may be integrally formed with the substrate 102. For example, the lens array 112 may be etched into the substrate 102 and/or formed by grayscale lithography or other suitable process.

The lens array 112 may include a first portion 116 and a second portion 118. The first and second portions 116, 118 may have different lenses from one another. For example, the first portion 116 may include concave lenses 114b and the second portion 118 may include convex lenses 114a (or vice versa). The lenses 114b of the first portion 116 may be negative optics (e.g., diverging optics) and the lenses 114a of the second portion 118 may be positive optics (e.g., converging optics). The lenses 114a, 114b may be configured to output substantially the same output optical profile. As will be described in further detail below, these opposite lenses 114a and 114b may counterbalance small alignment offsets in the laser array 104, thereby increasing the tolerance of the laser assembly 100 as a whole. Such configurations may permit the lenses 114 of the laser array 104 to be aligned with the lasers 106 on the other side of the substrate 102 within fabrication tolerance capabilities. The concave lenses 114b and convex lenses 114a may map the irradiance of the lasers to a common target irradiance profile, resulting in an alignment tolerant laser assembly.

In the illustrated configuration, one half of the lens array 112 includes the first portion 116 and one half of the lens array 112 includes the second portion 118. In such configurations there is an equal number of the lenses 114a and the lenses 114b. The first portion 116 is positioned on one side of the lens array 112 and the second portion 118 is positioned on an opposite side of the lens array 112. However, other configurations may be implemented. For example, the lens array 112 may include more or fewer of the lenses 114a and/or the lenses 114b. Furthermore, other configurations of the first and second portions 116, 118 may be implemented. For example, the lenses 114a may alternate rows with the lenses 114b. In such configurations, the first portion 116 may alternate rows with the second portion 118 in the lens array 112. In further configurations, the lenses 114 may alternate between the lenses 114a and the lenses 114b throughout the lens array 112. In such configurations, the lenses 114a may be positioned between two of the lenses 114b, and the first and second portions 116, 118 may alternate per lens throughout the lens array 112. Such configurations may include "checkerboard" configurations for the lenses 112a, 114b. In further configurations, the lenses 112a, 114b may be randomly dispersed in the lens array 112 in any suitable configuration. Although several example configurations for the first and second portions 116, 118 (and the lenses 114a, 114b) are described, other suitable configurations may be implemented according to concepts described in this disclosure.

As mentioned above, in some configurations the lens array 112 may be etched into the substrate 102 and/or formed by grayscale lithography, and therefore the lenses 114 may be integrally formed with the substrate 102. In other configurations, the lenses 114 of the lens array 112 may not be integral to the substrate 102. For example, the lenses 114 may be deposited on the substrate 102. In another example, the lenses 114 and the lens array 112 may be fabricated on a wafer separate from the substrate, the optical wafer may then be bonded to the substrate 102. In such configurations, active optical alignment may be implemented prior to bonding for high precision optical alignment of the lenses 114 and the lens array 112 and the lasers 106 of the laser array 104. Furthermore, the laser assembly 100 may include two substrates, for example, one with the lenses 114 and the lens array 112, and another with the lasers 106, that are optically aligned and bonded to one another.

Although the illustrated example includes concave lenses 114b and convex lenses 114a, other negative optics (e.g., diverging optics) and positive optics (e.g., converging optics) may be implemented. For example, negative optics may include biconcave, plano-concave, negative meniscus or other suitable optical configurations. In another example, positive optics may include biconvex, plano-convex, positive meniscus or other suitable optical configurations.

FIG. 1C is a bottom perspective view of a portion of the laser assembly 100. FIG. 1C illustrates the lasers 106 and the electrical contacts 108 in further detail. As shown, traces or electrical couplings 110 extend between the electrical contacts 108 and the lasers 106 to electrically couple them to one another. The electrical contacts 108 and the electrical couplings 110 may supply an electrical power source to each of the lasers 106 to drive the lasers 106 to transmit optical signals.

The electrical contacts 108 and/or the electrical couplings 110 may be formed of or include any suitable conductive material. In one example, the electrical contacts 108 may include copper (Cu) pillars with silver-tin (AgSn) solder positioned therein. In another example, the electrical couplings 110 may include copper or gold traces deposited on the surface of the substrate 102.

Various assembly and packaging configurations may be implemented to manufacture the laser assembly 100. In one example the laser assembly 100 is a flip chip laser assembly. In such configurations, solder bumps may be positioned in the pillars of the electrical contacts 108. The laser assembly 100 may then be flipped over so that its top side faces down, and aligned so that the electrical contacts 108 align with matching pads on another component. The laser assembly 100 and the component may be mechanically and electrically coupled to one another by solder reflow, such that the electrical contacts 108 to the matching pads using the solder bumps. Accordingly, the substrate 102 and/or the laser assembly 100 may be flip chip mounted to another component.

Figure 2A:
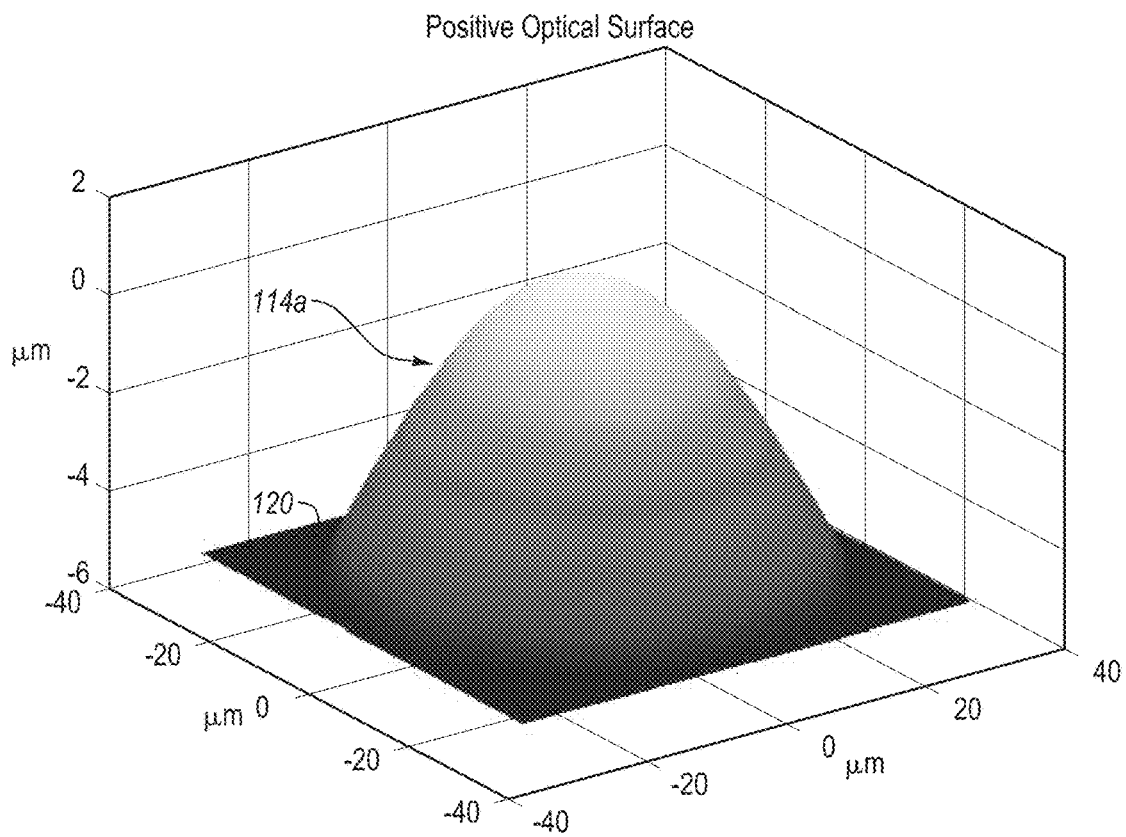
FIGS. 2A-2C are perspective views of example lenses which may be implemented in the laser assembly of FIGS. 1A-1C.
Figure 2B:
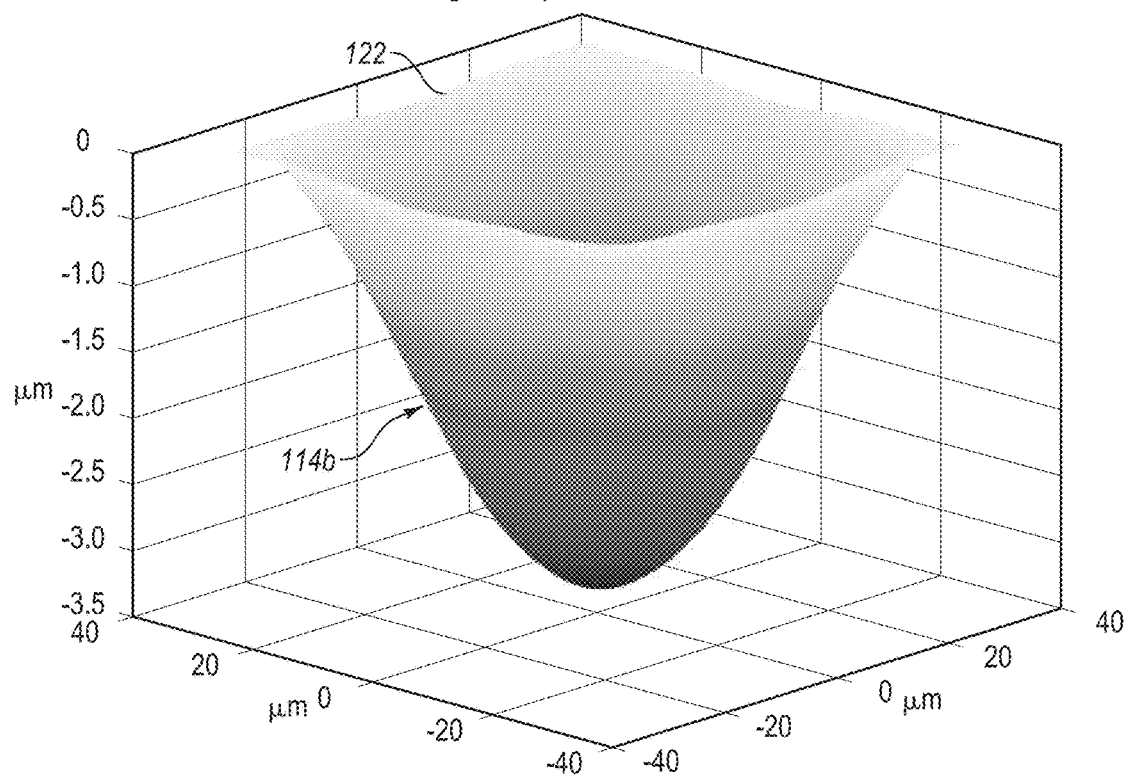

As mentioned, the laser assembly 100 may include convex lenses and concave lenses, such as the lenses 114a and 114b. FIG. 2A is a perspective view of the lens 114a and FIG. 2B is a perspective view of the lens 114b. FIGS. 2A and 2B illustrate the lenses 114a, 114b in further detail. Although FIGS. 2A-2B illustrate the lenses 114a, 114b on an XYZ scale with dimensions in micrometers (μm), the lenses 114a, 114b may have other configurations with differing shapes and dimensions as may be applicable.

As shown in FIG. 2A, the lens 114a includes a convex shape with respect to a plane, denoted at 120. In some aspects, the plane 120 may correspond to a surface of the substrate 102, on which the lens 114a may be positioned or integrally formed. The lens 114a may be a positive optical surface or a converging lens.

As shown in FIG. 2B, the lens 114b includes a concave shape with respect to a plane, denoted at 122. In some aspects, the plane 122 may correspond to a surface of the substrate 102, on which the lens 114b may be positioned or integrally formed. The lens 114b may be a negative optical surface or a diverging lens.

The lenses 114a and/or 114b may be etched into the substrate 102 and/or formed by grayscale lithography or other suitable process. For example, grayscale lithography may be used to form the shape of the lenses in a photoresist on the surface of the substrate 102. The surface may then be transfer etched into the substrate 102 through reactive ion etching.

Figure 2C:
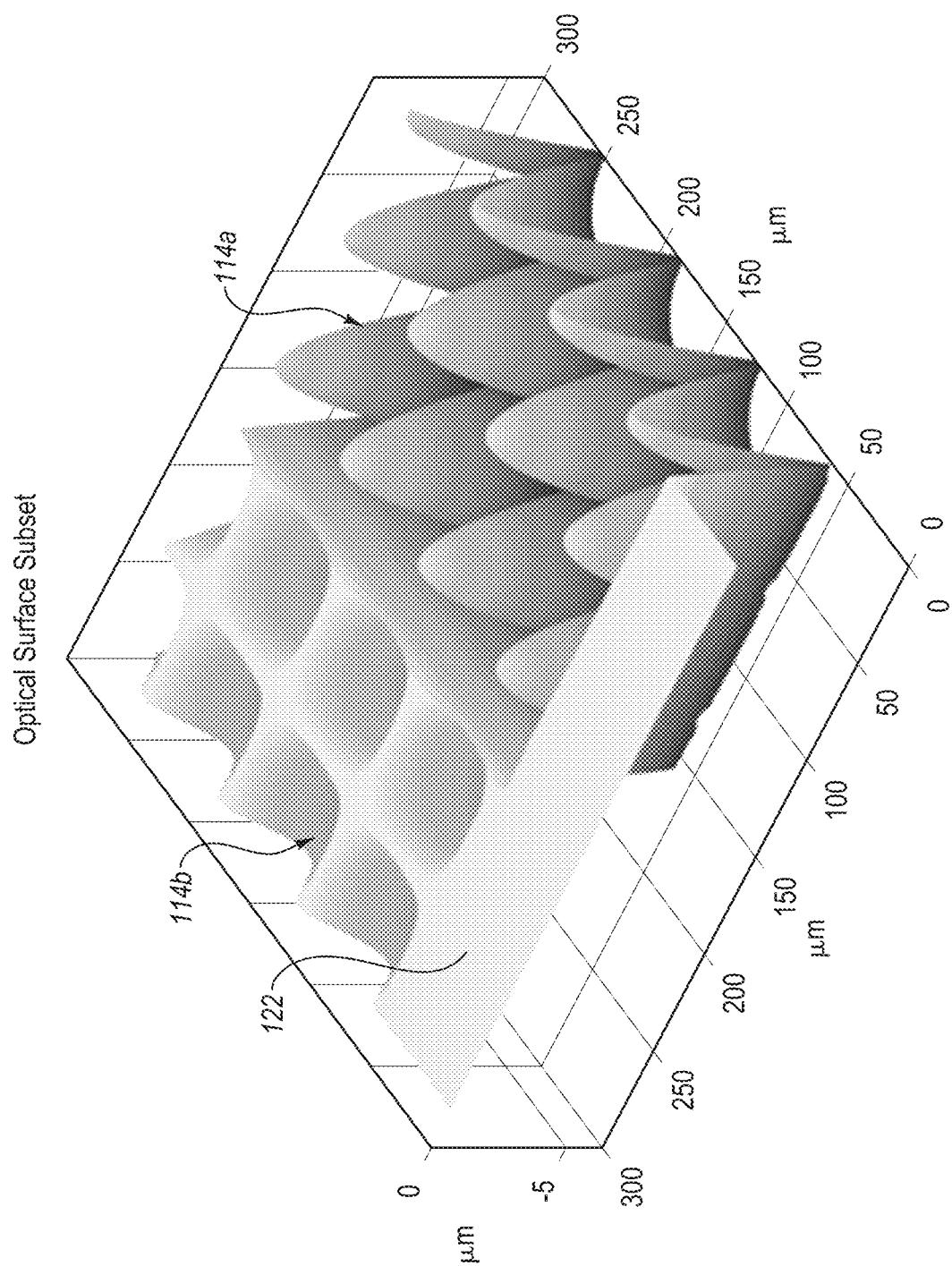

FIG. 2C is a perspective view of a configuration with both the lenses 114a and the lenses 114b. Although FIG. 2C illustrates the lenses 114a, 114b on an XYZ scale with dimensions in micrometers (μm), the lenses 114a, 114b may have other configurations with differing shapes and dimensions as may be applicable. As shown, the plane 122 includes depression structures on the surface for the convex lenses 114b and dome-like structures for the concave lenses 114a.

The lenses 114a, 114b may be freeform surfaces that are designed to redistribute the optical signals (e.g., illumination intensity) to a target profile at a surface a desired distance away. The lenses 114a, 114b may diverge, refract and/or direct the optical signals in preferred directions to conform to a desired target profile. In some configurations, the target profiles may be larger than the natural divergence of the lasers 106 in order to be able to design the concave lenses 114b. Accordingly, the angle that the lenses 114a, 114b diverge the optical signals may be greater than the natural divergence angle of the lasers 106. For example, the illumination angle requirements may be significantly greater than 30 degrees. In comparison, natural optical divergence for a VCSEL laser may be approximately 20 degrees.

As mentioned, the lens 114 may diffuse, transmit, direct, refract and/or focus the optical signals from the lasers 106 after they have travelled through the substrate 102. FIG. 3 is a cross-sectional schematic view of the laser assembly 100. With reference to FIG. 3, the behavior of optical signals travelling through the laser assembly 100 will be described in further detail.

As shown in FIG. 3, one of the lasers 106 may generate an optical signal 124. The laser 106 is oriented to generate and transmit the optical signal 124 through the substrate 102. The optical signal 124 travels through the substrate 102 to the lens 114. The lens 114 diffuses and/or diverges the optical signal 124 as it travels to a target 126. Although only one optical signal 124 is shown in FIG. 3 for illustration, each of the lasers 106 may generate a corresponding optical signal, which may in turn be diffused in a similar manner by each of the lenses 114.

Figure 4A:
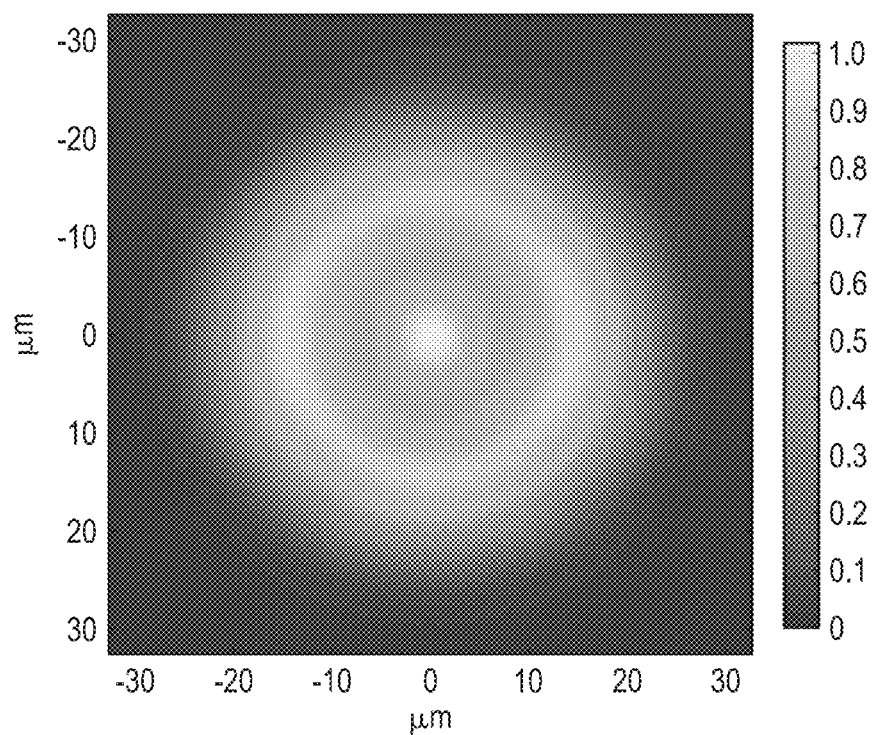
FIGS. 4A-4B illustrate example irradiance profiles of optical signals of the laser assembly of FIGS. 1A-1C and 3.

FIG. 4A illustrates an example irradiance profile of the optical signal 124 at position A in FIG. 3. In particular, FIG. 4A illustrates the irradiance of the optical signal 124 at the lens 114. As mentioned, lasers for flood illuminators (such as VCSELs or the like) may generate optical signals with optical profiles or irradiance which may not be ideal for illuminating a target. As shown, the irradiance of the optical signal 124 generated by the laser 106 (before it passes through the lens 114) is substantially annular. Accordingly, the optical signal 124 generated at the laser 106 would not evenly illuminate a target. The irradiance profile of FIG. 4A may be referred to as the near field intensity because it represents the irradiance profile of the optical signal 124 proximate the lens 114 before the optical signal 124 has been diffused.

Figure 4B:
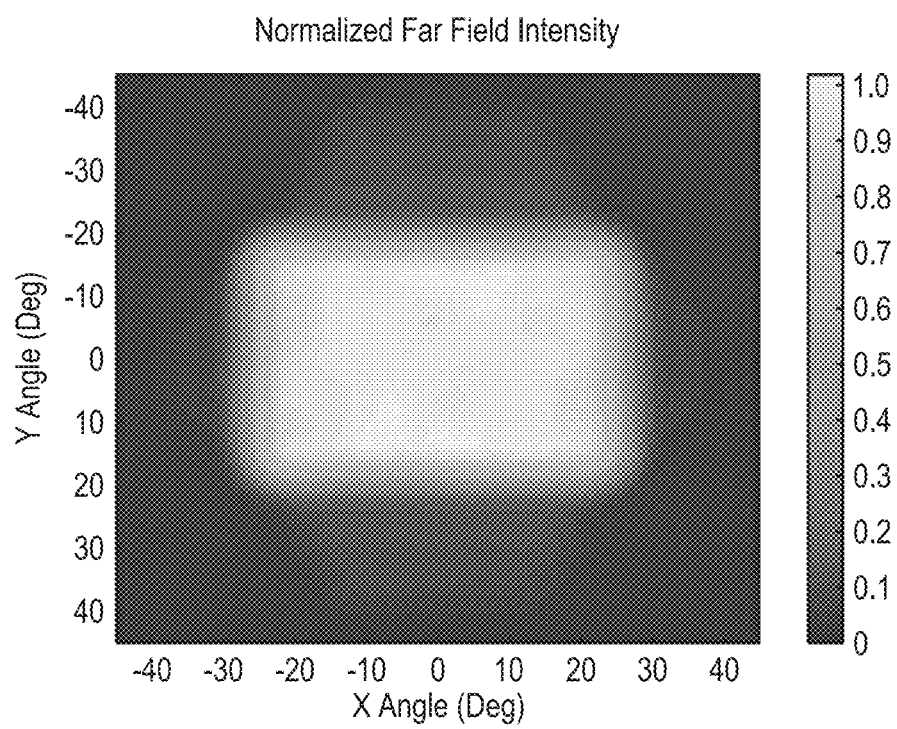

FIG. 4B illustrates an example irradiance profile of the optical signal 124 at position B in FIG. 3. In particular, FIG. 4B illustrates the irradiance of the optical signal 124 at the target 126. As shown, the irradiance of the optical signal 124 at the target 126 is substantially rectangular and even in intensity as a result of diffusion caused by the lens 114. Accordingly, the optical signal 124 generated at the laser 106 evenly illuminates the target 126 after passing through the lens 114. Each of the lenses 114 of the lens array 112 may diffuse corresponding optical signals in the manner shown to generate a combined irradiance profile at the target 126 which is even and aligned. The irradiance profile of FIG. 4B may be referred to as the far field intensity because it represents the irradiance profile of the optical signal 124 at the target 126 after the optical signal 124 has been diffused by the lens 114.

The irradiance profile shown in FIG. 4B is an example of a circumstance where the lasers (e.g., the lasers 106) and the optics (e.g., the lenses 114) are in a substantially ideal configuration; without offsets between the lasers and the optics or other imperfections that may result from manufacturing variations or other circumstances. However, variations in manufacturing may result in imperfections in the lasers and/or the optics. Such variations may result in, for example, an offset between the lasers 106 and the lenses 114. In such circumstances, one or more of the lasers 106 may not be perfectly aligned or centered with its corresponding lens 114. An offset between the laser 106 and the lens 114 may change the optical signals and the resulting irradiance profile, and FIGS. 5A-5B illustrate example irradiance profiles of optical signal resulting from offsets between the laser 106 and the lens 114.

Figure 5A:
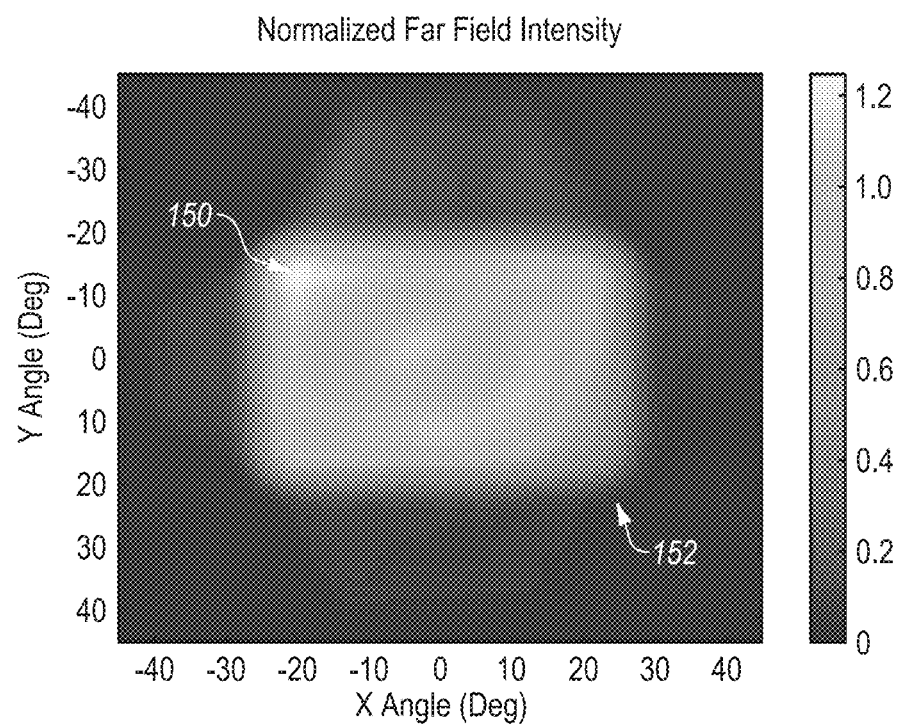
FIGS. 5A-5C illustrate example irradiance profiles of optical signals of the laser assembly of FIGS. 1A-1C and 3.
Figure 5B:
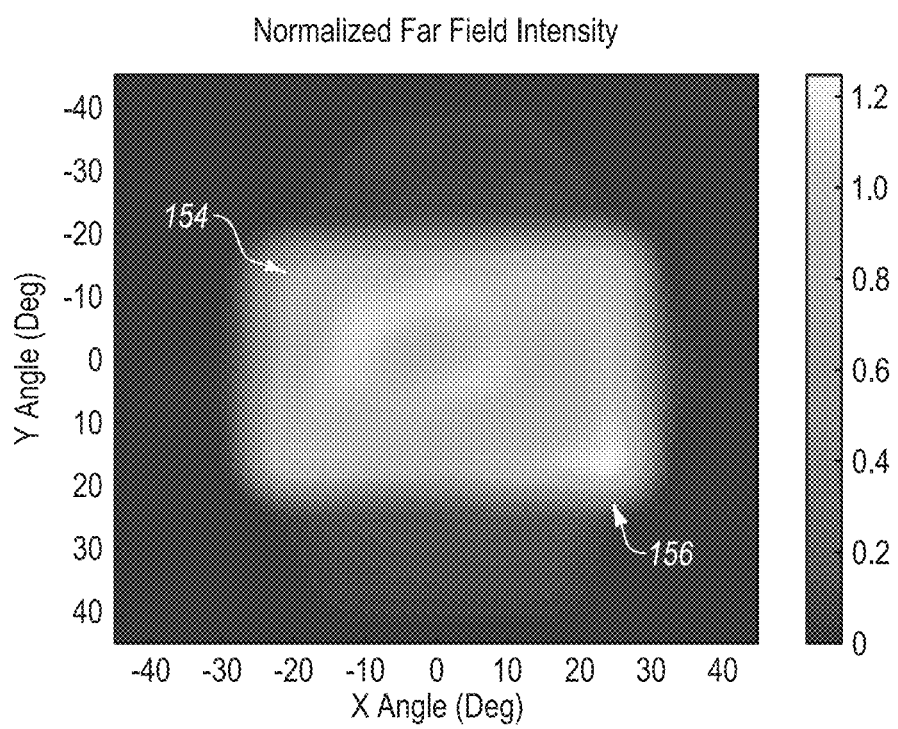

In particular, FIGS. 5A-5B illustrate irradiance profiles of optical signals resulting from lenses that are offset from their corresponding lasers by 2 μm. FIG. 5A illustrates the irradiance profile of a positive optic, such as one of the convex lenses 114a of FIG. 1B, offset from its corresponding laser by 2 μm. FIG. 5B illustrates the irradiance profile of a negative optic, such as one of the concave lenses 114b of FIG. 1B, offset from its corresponding laser by 2 μm. The irradiance profiles of FIGS. 5A-5B may be referred to as the far field intensity because it represents the irradiance profile of the optical signals at a target (e.g., the target 126) after the optical signals have been diffused by the lenses 114a or 114b.

As shown, the irradiance profiles of the optical signals are not uniform due the offsets between the lasers and the lenses. In particular, in FIG. 5A the intensity of the optical signals is relatively brighter than average at position 150 (e.g., proximate the top left corner of the rectangle) and relatively dimmer than average at position 152 (e.g., proximate the bottom right corner of the rectangle). That is, the signal intensity is greater than average at position 150 and smaller than average at position 152. In FIG. 5B the intensity of the optical signals is relatively dimmer than average at position 154 (e.g., proximate the top left corner of the rectangle) and relatively brighter than average at position 156 (e.g., proximate the bottom right corner of the rectangle). That is, the signal intensity is smaller than average at position 150 and greater than average at position 152.

As shown in FIGS. 5A and 5B, the same amount of offset for different types of lenses (e.g., negative versus positive; concave versus convex) results in substantially opposite imperfections in the irradiance profiles or the optical field intensities. Thus, opposite lenses, such as the convex lenses 114a and the concave lenses 114b, may be implemented in a lens array to counterbalance the imperfections caused by alignment offsets.

Figure 5C:
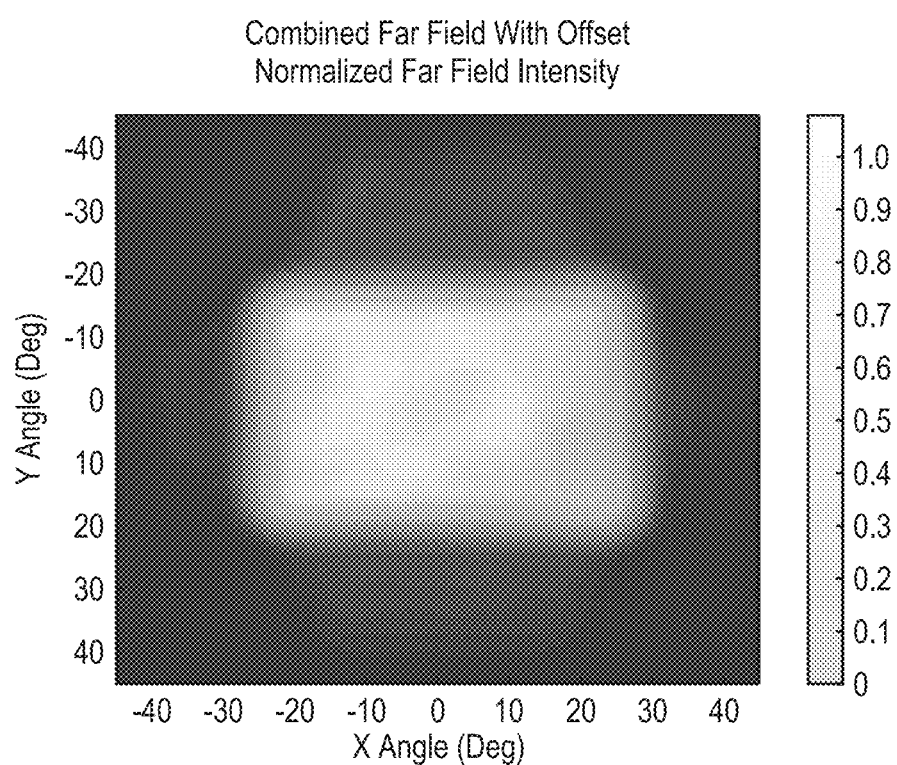

FIG. 5C illustrates an irradiance profile for the optical signals of FIGS. 5A and 5B combined with one another. In particular, FIG. 5C illustrates the far field intensity resulting from additive compensation of the outputs of the convex lens (e.g., positive optic) and the concave lens (e.g., negative optic) of FIGS. 5A and 5B. As shown, the irradiance profile of FIG. 5C is more uniform in intensity throughout the rectangular target area. The intensity of the optical signals is not significantly brighter or dimmer than average in any given area. Accordingly, implementing both convex lenses and the concave lenses in a lens array counterbalances imperfections in the lasers and/or the lenses, such as imperfections caused by alignment offsets or other manufacturing variations. Such configurations may increase the tolerance of the lasers, lenses and the laser assembly as a whole because the components are less susceptible to variations in manufacturing. In addition, such configurations may permit the lenses and lasers to be manufactured and aligned with another within fabrication tolerance capabilities.

As mentioned, FIG. 4B illustrates an irradiance profile in a substantially ideal configuration without offsets between the lasers and the optics or other imperfections. Comparing FIG. 5C and FIG. 4B, the output of the counterbalanced irradiance profile of FIG. 5C is similar to the ideal circumstance where there are no offsets or imperfections. Accordingly, the configuration of FIG. 5C, with opposite optics in single lens array, counteracts effects of offsets, imperfections, manufacturing variations, and/or other circumstances, thereby resulting in more tolerant optics and/or optical components for lasers arrays.

Unless specific arrangements described herein are mutually exclusive with one another, the various implementations described herein can be combined in whole or in part to enhance system functionality or to produce complementary functions. Likewise, aspects of the implementations may be implemented in standalone arrangements. Thus, the above description has been given by way of example only and modification in detail may be made within the scope of the present invention.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B."

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A laser assembly comprising:
   a substrate;
   a lens array positioned on a first side of the substrate and having lenses; and
   a laser array positioned on a second side of the substrate opposite the first side and having lasers,
   wherein each of the lasers of the laser array is oriented to generate optical signals through the substrate to an individual one of the lenses of the lens array corresponding to the each laser, at least one of the lenses being a concave lens and at least another one of the lenses being a convex lens.

2. The laser assembly of claim 1, wherein the concave lens and the convex lens refract the optical signals to a same target.

3. The laser assembly of claim 1, wherein the lens array is a field mapping optic that refracts the optical signals from the lasers of the laser array to a desired irradiance at a target, and each of the lenses of the lens array refract the optical signals of a corresponding one of the lasers of the laser array.

4. The laser assembly of claim 1, wherein the lenses of the lens array are substantially aligned with each corresponding laser of the laser array.

5. The laser assembly of claim 1, wherein the at least one concave lens and the at least one convex lens counterbalance alignment offsets with their corresponding lasers.

6. The laser assembly of claim 1, wherein the substrate includes gallium arsenide.

7. The laser assembly of claim 1, wherein the lasers of the laser array are vertical-cavity surface-emitting lasers.

8. The laser assembly of claim 1, wherein the lenses of the lens array are formed by grayscale lithography or etching.

9. The laser assembly of claim 1, further comprising electrical contacts positioned on the substrate to transmit electrical signals to drive the lasers of the laser array.

10. The laser assembly of claim 1, wherein the substrate is flip chip mounted to another component.

11. A laser assembly comprising:
    a substrate;
    a lens array positioned on a first side of the substrate and having optics; and
    a laser array positioned on a second side of the substrate opposite the first side and having lasers,
    wherein each of the lasers of the laser array is oriented to generate optical signals through the substrate to an individual one of the optics of the lens array corresponding to the each laser, the lens array comprising a first portion including positive ones of the optics and a second portion including negative ones of the optics.

12. The laser assembly of claim 11, wherein the positive optics are convex lenses and the negative optics are concave lenses.

13. The laser assembly of claim 11, wherein the positive optics and the negative optics refract the optical signals to a same target.

14. The laser assembly of claim 11, wherein the lens array is a field mapping optic that refracts the optical signals from the lasers of the laser array to a desired irradiance at a target, and each of the optics of the lens array refract the optical signals of a corresponding one of the lasers of the laser array.

15. The laser assembly of claim 11, wherein the positive optics and the negative optics counterbalance alignment offsets with their corresponding lasers of the laser array.

16. The laser assembly of claim 11, wherein the positive optics and the negative optics diverge the optical signals from the lasers of the laser array at an angle greater than a natural divergence angle of the lasers of the laser array.

17. The laser assembly of claim 11, wherein the substrate includes gallium arsenide and the lasers of the laser array are vertical-cavity surface-emitting lasers.

18. A laser assembly comprising:
    a substrate;
    a laser array positioned on a first side of the substrate, the laser array comprising lasers oriented to generate optical signals directed through the substrate; and
    a field mapping optic that refracts the optical signals from the lasers of the laser array to a desired irradiance at a target, the field mapping optic positioned on a second side of the substrate opposite the first side, the field mapping optic comprising a positive optic and a negative optic separate from the positive optic, each of the positive optic and the negative optic corresponding to an individual one of the lasers and configured to refract the optical signal therefrom.

19. The laser assembly of claim 18, wherein the positive optic includes at least one convex lens, and the negative optic includes at least one concave lens.

20. The laser assembly of claim 18, wherein the positive optic and the negative optic counterbalance alignment offsets with their corresponding lasers of the laser array.

* * * * *